United States Patent
Eun

(10) Patent No.: US 7,932,168 B2
(45) Date of Patent: Apr. 26, 2011

(54) METHOD FOR FABRICATING BITLINE IN SEMICONDUCTOR DEVICE

(75) Inventor: Byung Soo Eun, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 7 days.

(21) Appl. No.: 12/639,779

(22) Filed: Dec. 16, 2009

(65) Prior Publication Data

US 2010/0330804 A1    Dec. 30, 2010

(30) Foreign Application Priority Data

Jun. 30, 2009  (KR) .................. 10-2009-0059362

(51) Int. Cl.
*H01L 21/44* (2006.01)

(52) U.S. Cl. ........ 438/597; 438/238; 438/241; 438/652; 257/E21.656; 257/E21.657; 257/E21.658

(58) Field of Classification Search .................. 438/238, 438/241, 597, 652; 257/E21.656, E21.657, 257/E21.658

See application file for complete search history.

(56) References Cited

U.S. PATENT DOCUMENTS

| 6,232,224 | B1 * | 5/2001 | Inoue ......................... 438/639 |
| 6,784,084 | B2 * | 8/2004 | Kang et al. .................. 438/586 |
| 7,098,135 | B2 * | 8/2006 | Chung et al. ................ 438/694 |
| 2007/0096202 | A1 | 5/2007 | Kang et al. |
| 2007/0218684 | A1 * | 9/2007 | Kim ........................... 438/652 |
| 2008/0081469 | A1 * | 4/2008 | Kim ........................... 438/675 |
| 2009/0218610 | A1 | 9/2009 | Goo et al. |
| 2010/0219530 | A1 * | 9/2010 | Ryu ........................... 257/751 |

* cited by examiner

*Primary Examiner* — Michael S Lebentritt
*Assistant Examiner* — Daniel Whalen
(74) *Attorney, Agent, or Firm* — Marshall Gerstein & Borun LLP

(57) ABSTRACT

A method of a fabricating a bitline in a semiconductor device, comprising: forming an interlayer insulation layer that defines a bitline contact hole on a semiconductor substrate; forming a contact layer to fill the bitline contact hole; forming a bitline contact by planarizing the contact layer; forming a bitline stack aligned with the bitline contact; forming a high aspect ratio process (HARP) layer that extends along the bitline stack and the interlayer insulation layer while covering a seam exposed in a side portion of the bitline stack by excessive planarization during formation of the bitline contact; and forming an interlayer gap-filling insulation layer on the HARP layer that gap-fills the entire bitline stack.

9 Claims, 6 Drawing Sheets

METHOD FOR FABRICATING BITLINE IN SEMICONDUCTOR DEVICE

CROSS-REFERENCE TO RELATED APPLICATION

Priority to Korean patent application number 10-2009-0059362 filed on Jun. 30, 2009, the entire disclosure of which is incorporated by reference, is claimed.

BACKGROUND OF THE INVENTION

The invention relates generally to fabrication of a semiconductor device and, more particularly, to a method of fabricating a bitline in a semiconductor device.

The critical dimension of a bitline stack has been sharply reduced in development of semiconductor devices as such devices have become more highly integrated. Since spaces disposed between the bitline stacks have also been reduced in size due to reduction in the critical dimension of the bitline stack, it is difficult to gap-fill the bitline stack with previously-employed gap-filling methods. In one method of gap-filing the bitline stack, a high density plasma (HDP) process is employed. However, with the reduction in the critical dimension of the bitline stack, there occurs a bending phenomenon wherein a bit line stack is inclined in a direction when the bitline stack is gap-filled using the high density plasma process. This bending phenomenon is caused by an abnormal deposition of an oxide layer on both sides of the bitline stack upon deposition using the high density plasma process or by damage due to plasma in the high density plasma process.

Due to this limitation in the process, most bitline stacks currently employ a spin on dielectric (SOD). The spin on dielectric is formed by spin coating of a liquid compound, substitution with an oxide layer using a high temperature curing process, and gap-filling. The spin on dielectric has been developed for an isolation material, but is now being developed, in fine devices, for use in a process requiring gap-filling such as in a gate stack or bitline stack. However, as device sizes become smaller, the spin on dielectric also has a problem in that a surface of the spin on dielectric is cracked due to variation in stress and variation in volume of the spin on dielectric itself during the curing process for the spin on dielectric or a subsequent thermal process.

To overcome the aforementioned problems, there has been proposed a method of gap-filling a bitline stack using a dual layer of a spin on dielectric employed in an isolation process and a high density plasma oxide layer. The proposed method is a process of gap-filling a bitline stack by coating the bitline stack with a spin on dielectric, implementing a curing process, planarizing the gap-filled spin on dielectric, etching a predetermined height, and then additionally gap-filling bitline stack using a high density plasma oxide layer. This dual layer of the spin on dielectric and the high density plasma oxide layer has an excellent gap-filling property and can prevent the bending defect, but requires additional process steps and creates an additional problem caused by the lower placed spin on dielectric.

Particularly, the spin on dielectric remaining in a peripheral region causes a gap-filling defect of a metal wiring line and a lifting defect of the spin on dielectric. The gap-filling defect of the metal wiring line is generated when a barrier metal layer of the metal line contact is deposited non-uniformly due to outgassing from the spin on dielectric when the metal line comes in contact with the spin on dielectric present at a side face of the metal line due to misalignment upon formation of a metal line contact mask. Also, in the lifting defect of the spin on dielectric, a large sized plate-like defect is generated as, when the spin on dielectric is used for each of an isolation layer, a first interlayer insulation layer, and a second interlayer insulation layer, the spin on dielectric layers are stacked from a lower side and the spin on dielectric is separated in a subsequent thermal process.

In another example, there has been developed a method of implementing deposition-etch-deposition (DED) and deposition-wet etch-deposition (DWD) processes when gap-filling between bitline stacks with a single layer of a high density plasma oxide layer. This method can improve the problems associated with gap-filling defects and plate-like defects, but is limited due to the lack of a gap-fill margin and a bending margin.

As described above, gap-filling between the bitline stacks using the single layer of the high density plasma layer, the single layer of the spin on dielectric, or the dual layer of the high density plasma oxide layer and the spin on dielectric is characterized by various problems in process reliability. Therefore, there is required a method that does not cause a defect and ensure process reliability while completely gap-filling between the bitline stacks.

SUMMARY OF THE INVENTION

In one embodiment, a method of fabricating a bitline in a semiconductor device comprises: forming an interlayer insulation layer that defines a bitline contact hole on a semiconductor substrate; forming a contact layer to fill the bitline contact hole; forming a bitline contact by planarizing the contact layer; forming a bitline stack aligned with the bitline contact; forming a high aspect ratio process (HARP) layer that extends along the bitline stack and the interlayer insulation layer while covering a seam exposed in a side portion of the bitline stack by excessive planarization during forming of the bitline contact; and forming an interlayer gap-filling insulation layer on the HARP layer that gap-fills the entire bitline stack.

Preferably, the contact layer comprises a chemical vapor deposited tungsten layer and the bitline stack preferably comprises a physical vapor deposited tungsten layer.

Preferably, the contact layer is planarized by chemical mechanical polishing.

Preferably, the HARP layer is formed by: disposing the semiconductor substrate on which the seam is exposed within deposition equipment; and forming the HARP layer by an oxidation process under an atmosphere of ozone and tetraethyl-ortho silicate ($O_3$-TEOS).

Preferably, the oxidation process is implemented by supplying a deposition gas comprising TEOS gas, ozone gas, a nitrogen gas, and $N_2$-TEOS gas while maintaining a deposition temperature at 500 degrees Celsius to 550 degrees Celsius and a deposition pressure at 400 Torr to 460 Torr.

Preferably, the HARP layer is formed to a thickness of 150 Å to 250 Å so that the HARP layer functions as an attack prevention layer in an initial stage of deposition of the interlayer gap-filling layer while covering the exposed seam.

Preferably, the interlayer gap-filling layer further includes a high density plasma liner oxide layer that prevents attack applied on the bitline stack in an initial stage of the high density plasma process.

DESCRIPTION OF SPECIFIC EMBODIMENTS

Preferred embodiments of the invention are described in detail below with reference to the accompanying drawings.

FIGS. 1 through 8 illustrate process steps for fabricating a bitline in a semiconductor device in accordance with an embodiment of the invention.

Figure 1:
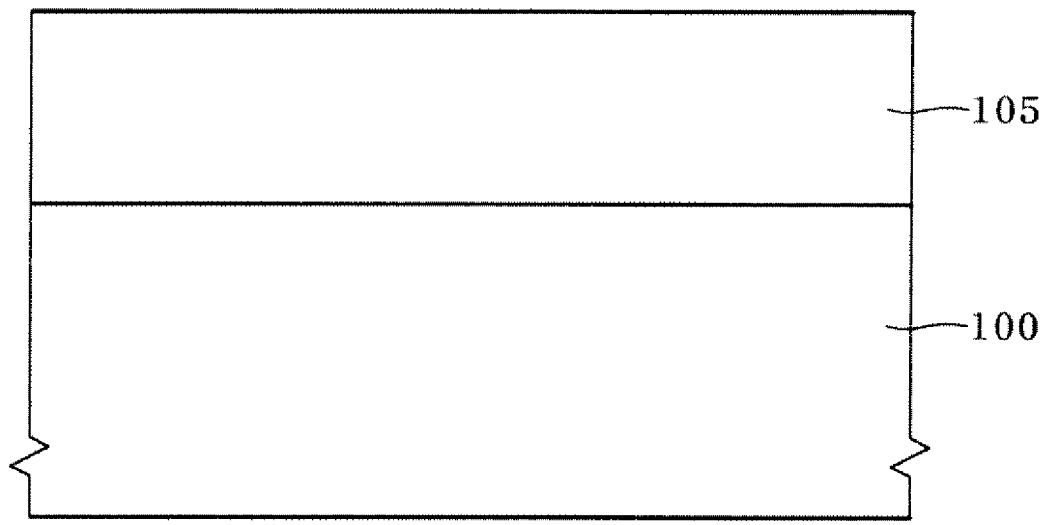
FIGS. 1 through 8 illustrate process steps for fabricating a bitline in a semiconductor device in accordance with an embodiment of the invention.

Referring to FIG. 1, an interlayer insulation layer 105 is formed on a semiconductor substrate 100. The semiconductor substrate 100 includes an understructure (not shown) including landing plugs (not shown) to be connected with wordlines and a bitline stack formed between the wordlines. The interlayer insulation layer 105 is illustratively formed of a flowable dielectric layer, e.g., a boron phosphorus silicate glass (BPSG) layer.

Figure 2:
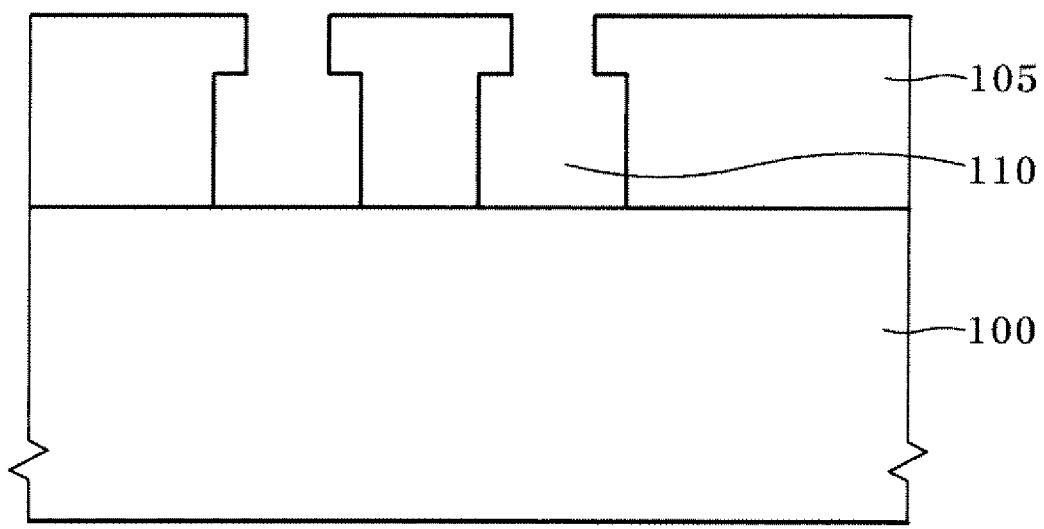

Referring to FIG. 2, the interlayer insulation layer 105 is selectively etched to form bitline contact holes 110. To this end, a resist pattern for forming a bitline contact is formed on the interlayer insulation layer 105. Next, the exposed portion of the interlayer insulation layer 105 is etched using the resist pattern as an etch mask to form the bitline contact holes 110 to be used for connecting a bitline stack to be formed later and a landing plug (not shown) thereunder.

Figure 3:
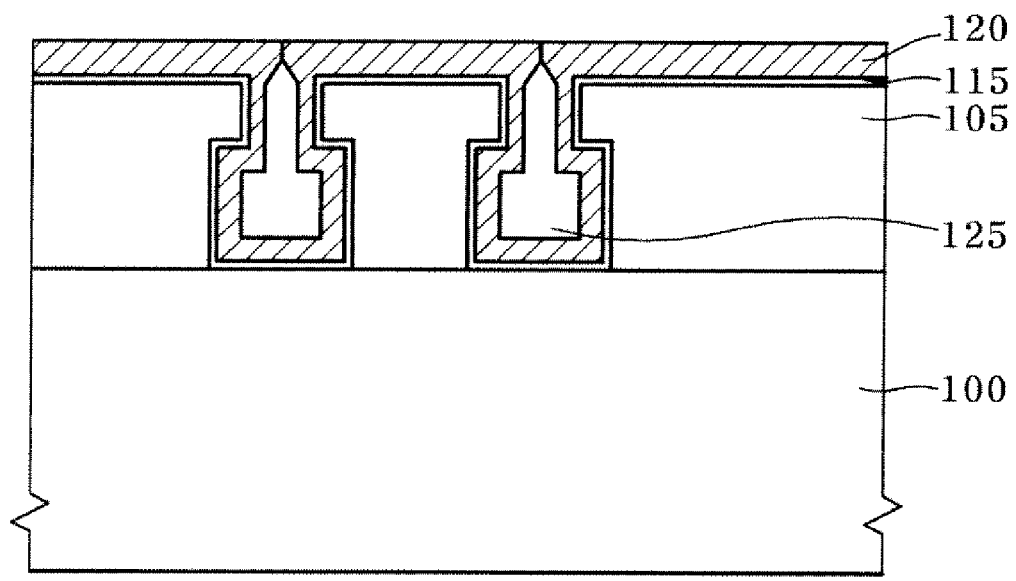

Referring to FIG. 3, a barrier metal layer 115 and a contact layer 120 are sequentially deposited on the bitline contact holes 110 and the interlayer insulation layer 105. The barrier metal layer 115 preferably is formed of a titanium/titanium nitride (Ti/TiN) layer. The barrier metal layer 115 functions as a glue layer that prevents reaction with source material or aids easy growth of the contact layer 120 upon deposition of the contact layer 120. The contact layer 120 preferably comprises a chemical vapor deposited tungsten layer (CVD-W layer). The contact layer 120 is employed together with a bitline conductive layer to be subsequently formed to reduce parasitic capacitance of the bitline stack.

Meanwhile, as semiconductor devices have been highly integrated, a critical dimension of the bitline stack has been reduced and an aspect ratio of the contact hole 110 has also been enlarged. Therefore, during gap-filling the bitline contact holes 110 with the contact layer 120, a narrow inlet of the bitline contact hole 110 is first gap-filled before the interior of the bitline contact hole 110 is completely gap-filled, and a seam 125 is thus generated within the bitline contact hole 110.

Figure 4:
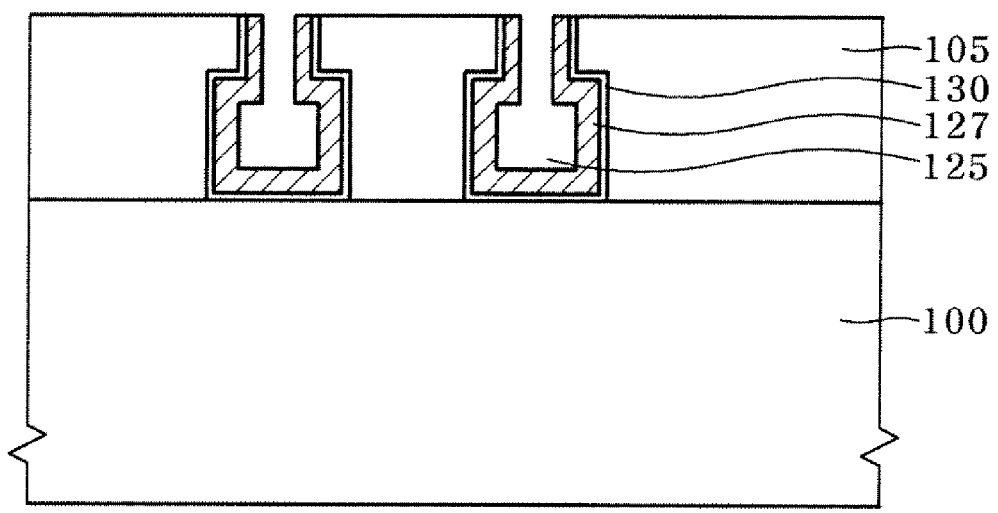

Referring to FIG. 4, a planarization process is implemented on the contact layer 120 (see FIG. 3) to remove the contact layer and the barrier metal layer above the interlayer insulation layer 105, thereby forming a bitline contact 127 and a barrier metal pattern 130. Herein, the planarization process preferably is implemented by chemical mechanical polishing (CMP). In this case, as a removed amount of the contact layer and the barrier metal layer in the inlet of the bitline contact hole 110 is increased, the seam 125 within the bitline contact hole 110 is exposed. When a bitline conductive layer is formed with the seam 125 being exposed and a mask process for forming a bit line stack is implemented, a misalignment occurs in the mask process, and thus the seam is shown under the bitline stack and a void due to the seam can be generated upon subsequent formation of a gap-filling layer for gap-filling the bitline stack. Therefore, a method of preventing the seam 125 within the bitline contact hole 110 from being exposed is required. This is described in detail below.

Figure 5:
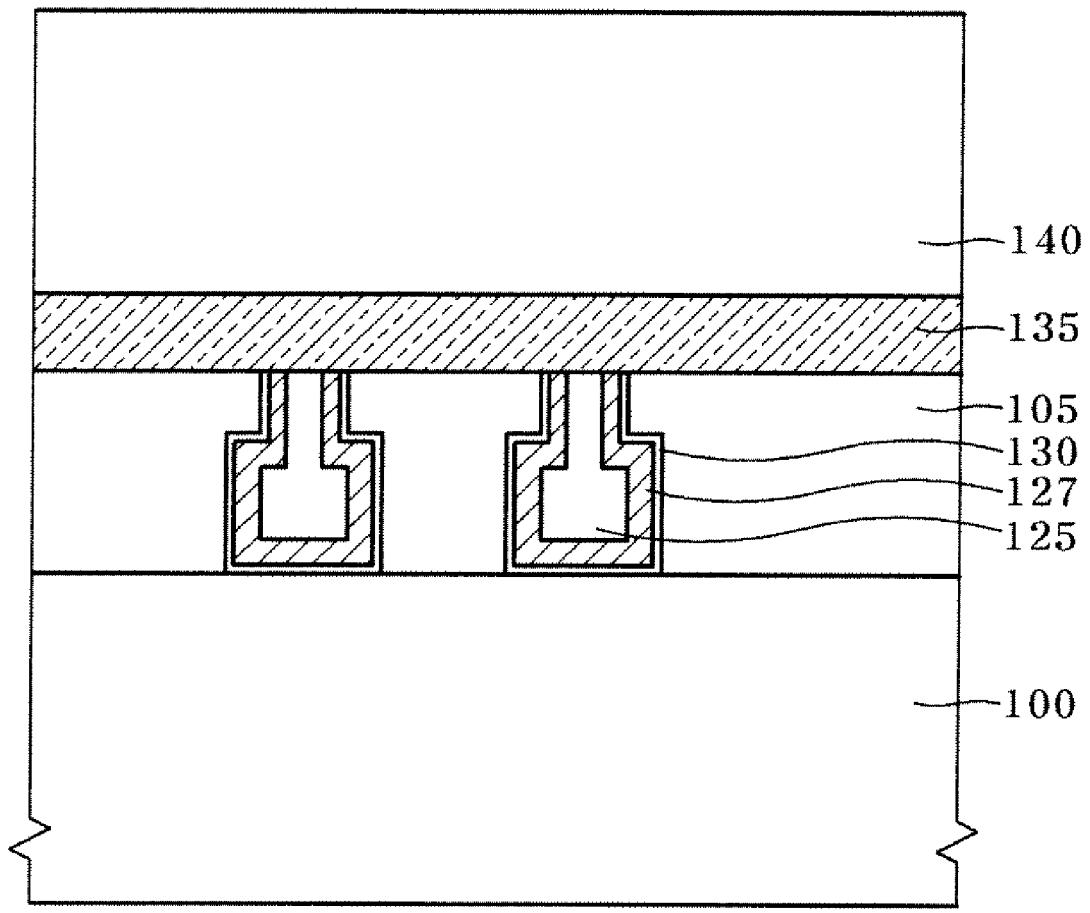

Referring to FIG. 5, a bitline conductive layer 135 and a hard mask layer 140 are sequentially formed on the bitline contact hole in which the seam 125 is exposed, the bitline contact 127, the barrier metal pattern 130, and the interlayer insulation layer 105. The bitline conductive layer 135 preferably comprises a physical vapor deposited tungsten layer (PVD-W layer). Also, the hard mask layer 140 can include a nitride layer. Herein, the bitline conductive layer 135 is employed together with a bitline contact 127 to reduce parasitic capacitance of the bitline stack. In this case, since the barrier metal layer is removed in the planarization process implemented to form the bitline contact 127 and it is thus possible to reduce total thickness of the bitline stack by low resistance of the physical vapor deposited bitline conductive layer 135, the parasitic capacitance between the bitline stacks is reduced.

Figure 6:
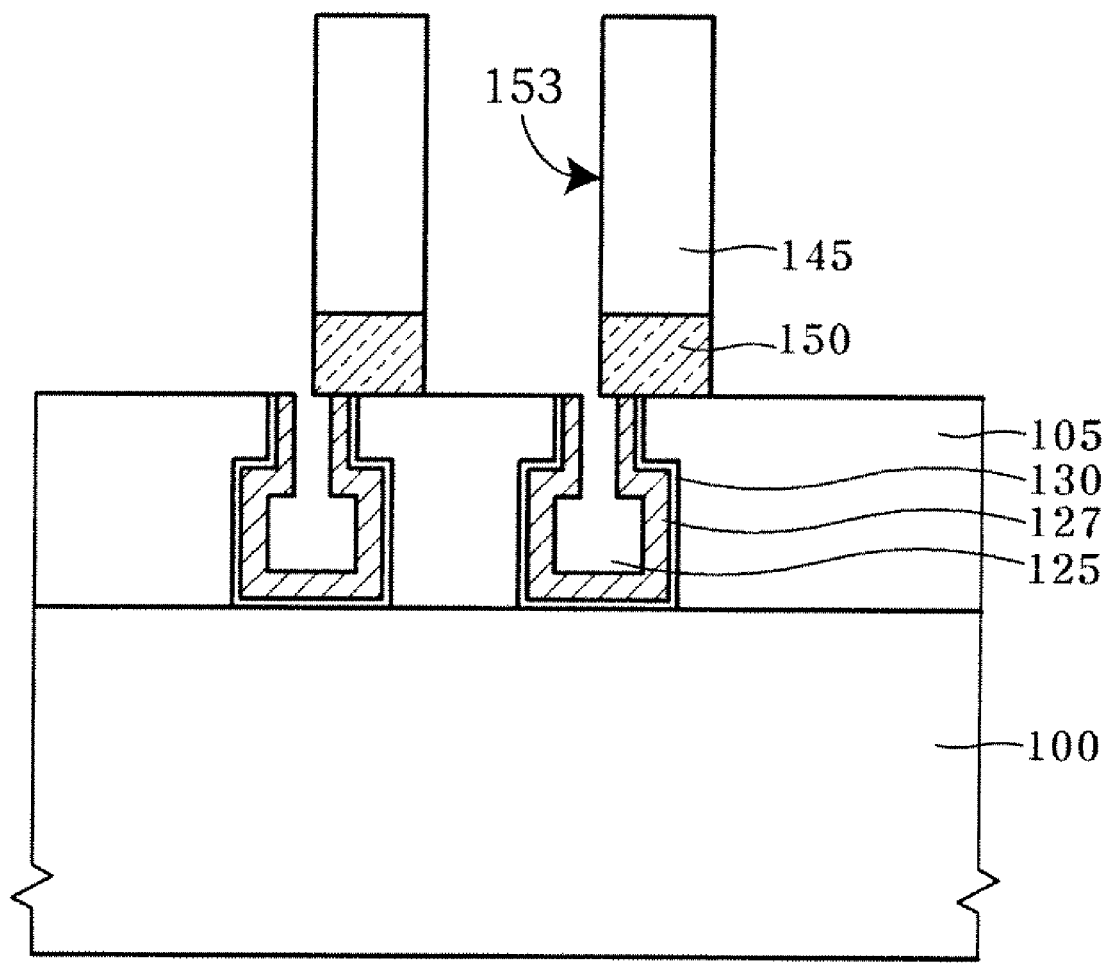

Referring to FIG. 6, the hard mask layer 140 and the bitline conductive layer 135 are patterned to form a bitline stack structure generally designated 153. Specifically, a photoresist layer is coated on the hard mask layer 140 and a photolithography process including exposure and development is then implemented to form a resist pattern (not shown) that exposes some portion of a surface of the hard mask layer 140. Next, the hard mask layer 140 and the bitline conductive layer 135 are etched using the resist pattern as an etch mask to form the bitline stack 153 aligned on the bitline contact 127. The bitline stack 153 includes a hard mask pattern 145 and the bitline conductive layer pattern 150. The seam 125 is partially exposed when an overlay is out of the bitline contact 127 and a misalignment thus occurs during formation of the resist pattern or when an over etch is implemented upon the etch process for forming the bitline stack 153.

Figure 7:
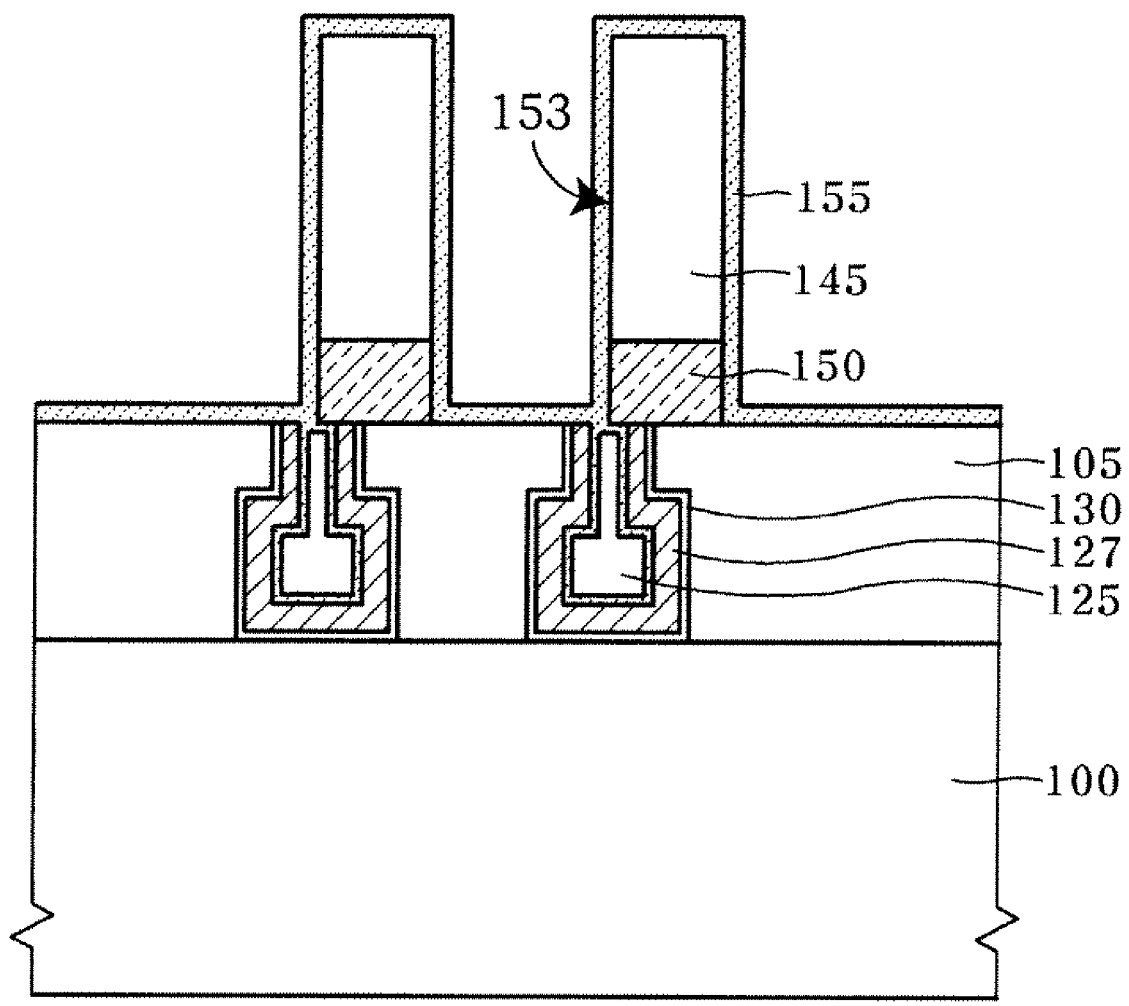

Referring to FIG. 7, an oxidation process is implemented under an atmosphere of ozone and tetra-ethyl-ortho silicate ($O_3$-TEOS) to form a high aspect ratio process (HARP) layer that extends along the bitline stack 153 and the interlayer insulation layer 105 while covering the exposed seam 125. Specifically, the semiconductor substrate 100 on which the seam is exposed 125 is disposed in deposition equipment. Deposition of the HARP layer 155 is implemented by a high aspect ratio process. To this end, into the deposition equipment, a TEOS gas is supplied, preferably at a flow ratio of 2000 sccm to 2200 sccm, an ozone gas is supplied, preferably at a flow rate of 13000 sccm to 17000 sccm, a nitrogen gas is supplied, preferably at a flow rate of 2700 sccm to 3300 sccm, and nitrogen and $N_2$-TEOS gas are supplied, preferably at a flow rate of 18000 sccm to 22000 sccm. Herein, a deposition temperature is maintained, preferably in the range of 500 degrees Celsius to 550 degrees Celsius and a deposition pressure is maintained, preferably in the range of 400 Torr to 460 Torr during the deposition. Then, as illustrated in FIG. 7, the HARP layer 155 is formed extending along the bitline stack 153 and the interlayer insulation layer 105 while covering the exposed seam 125. It is preferred that the HARP layer 155 is formed to a thickness of 150 Å to 250 Å to cover the exposed seam. Since the deposition by the high aspect ratio process has a step coverage of 100%, it is possible to gap-fill even a deep contact hole. Therefore, it is possible to completely cover the inlet of the exposed seam 125.

Figure 8:
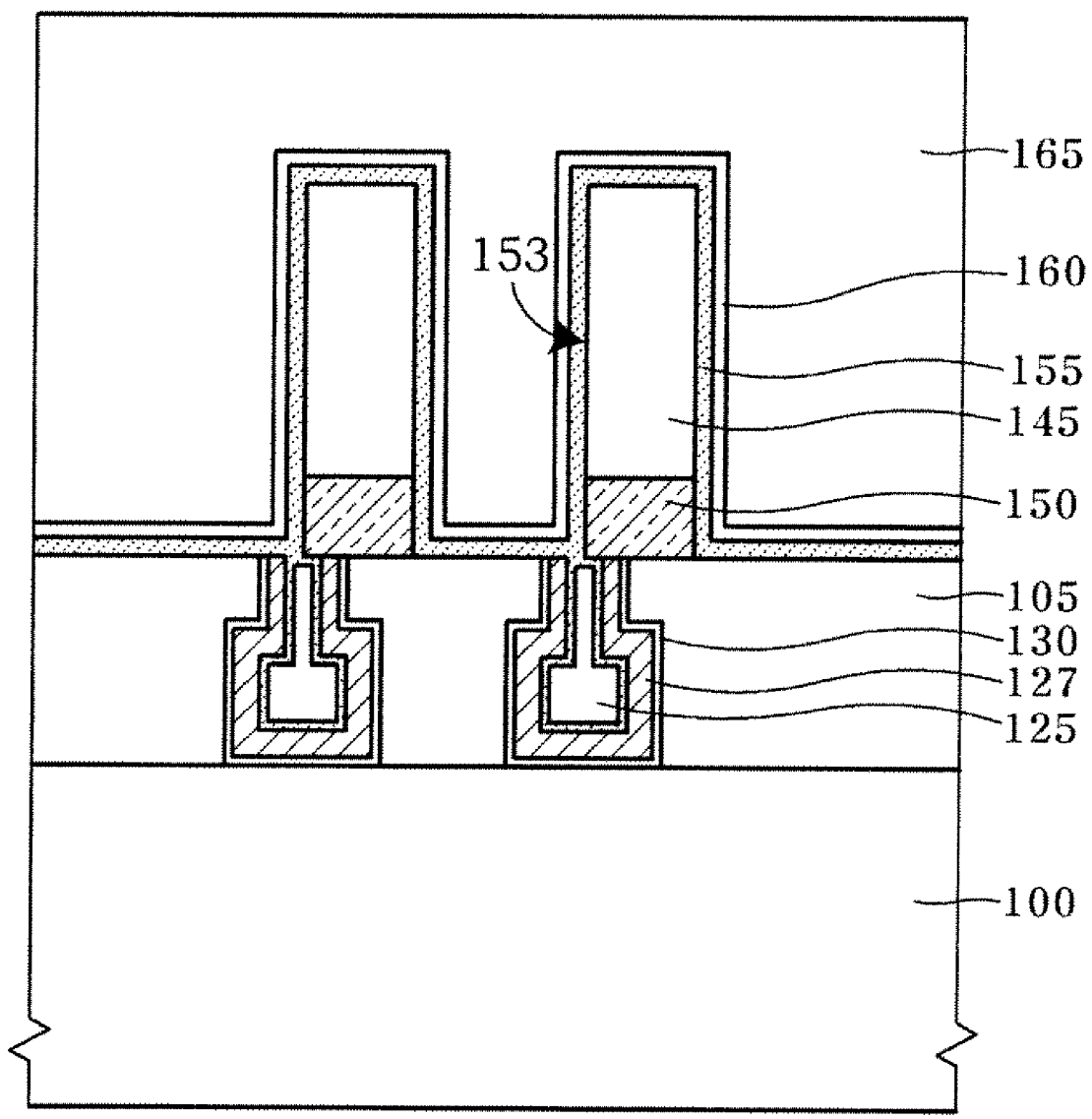

Referring to FIG. 8, an interlayer gap-filling layer 165, which gap-fills the entire bitline stack 153, is formed, preferably with a high density plasma oxide layer. Specifically, a high density plasma liner oxide layer 160 preferably is formed on the HARP layer 155 using a high density plasma process. Herein, the high density plasma liner oxide layer 160 preferably is formed to a reduced thickness of 100 Å compared to a thickness of 250 Å for the conventional interlayer gap-filling layer. It is possible to reduce the deposition thickness of the high density plasma liner oxide layer 160 because the HARP layer 155 can function as a high density plasma liner oxide layer that prevents attack applied on the hard mask pattern 145 in an initial stage of the high density plasma process. The high density plasma process preferably is continuously implemented to form the interlayer gap-filling layer 165 that gap-fills the entire bitline stack 153.

In accordance with the invention, it is possible to increase process reliability without a gap-filling margin by covering a seam exposed in a planarization process with a HARP layer formed by a high aspect ratio process having a step coverage of 100%, preferably when a CVD-W layer and a PVD-W layer are employed together to reduce a parasitic capacitance of a bitline stack.

While the invention has been described with respect to the specific embodiments, various changes and modifications may be made without departing from the spirit and scope of the invention as defined in the following claims.

What is claimed is:

1. A method of fabricating a bitline in a semiconductor device, comprising:
   forming an interlayer insulation layer that defines a bitline contact hole on a semiconductor substrate;
   forming a contact layer to fill the bitline contact hole;
   forming a bitline contact by planarizing the contact layer;
   forming a bitline stack aligned with the bitline contact, whereby a seam is exposed in a side portion of the bitline stack by excessive planarization when forming the bitline contact;
   forming a high aspect ratio process (HARP) layer that extends along the bitline stack and the interlayer insulation layer while covering the exposed seam in a side portion of the bitline stack; and
   forming an interlayer gap-filling insulation layer on the HARP layer to gap-fill the entire bitline stack.

2. The method of claim 1, wherein the contact layer comprises a chemical vapor deposited tungsten layer.

3. The method of claim 1, wherein the bitline stack comprises a physical vapor deposited tungsten layer.

4. The method of claim 1, comprising planarizing the contact layer by chemical mechanical polishing.

5. The method of claim 1, comprising forming the HARP layer by:
   disposing the semiconductor substrate on which the seam is exposed within deposition equipment; and
   forming the HARP layer by an oxidation process under an atmosphere of ozone and tetra-ethyl-ortho silicate ($O_3$-TEOS).

6. The method of claim 5, wherein the oxidation process comprises supplying deposition gas comprising a TEOS gas, ozone gas, a nitrogen gas, and $N_2$-TEOS gas while maintaining a deposition temperature at 500 degrees Celsius to 550 degrees Celsius and a deposition pressure of 400 Torr to 460 Torr.

7. The method of claim 1, comprising forming the HARP layer to a thickness of 150 Å to 250 Å so that the HARP layer functions as an attack prevention layer in an initial stage of the deposition of the interlayer gap-filling layer while covering the exposed seam.

8. The method of claim 1, wherein the interlayer gap-filling layer comprises a high density plasma oxide layer.

9. The method of claim 8, wherein the interlayer gap-filling layer further comprises a high density plasma liner oxide layer that prevents attack applied on the bitline stack in an initial stage of forming the high density plasma oxide layer.

* * * * *